(12) United States Patent
Alvarez et al.

(10) Patent No.: US 12,050,842 B2
(45) Date of Patent: Jul. 30, 2024

(54) SIMULATED VEHICLE OPERATION MODELING WITH REAL VEHICLE PROFILES

(71) Applicant: Intel Corporation, Santa Clara, CA (US)

(72) Inventors: Ignacio Alvarez, Portland, OR (US); Victor Palacios Rivera, Guadalajara (MX)

(73) Assignee: Intel Corporation, Santa Clara, CA (US)

( * ) Notice: Subject to any disclaimer, the term of this patent is extended or adjusted under 35 U.S.C. 154(b) by 538 days.

(21) Appl. No.: 17/353,173

(22) Filed: Jun. 21, 2021

(65) Prior Publication Data
US 2022/0012380 A1   Jan. 13, 2022

Related U.S. Application Data

(63) Continuation of application No. 15/869,313, filed on Jan. 12, 2018, now Pat. No. 11,048,832.

(51) Int. Cl.
| | | |
|---|---|---|
| *G06F 30/15* | (2020.01) | |
| *G06F 30/20* | (2020.01) | |
| *B60W 30/085* | (2012.01) | |
| *B60W 30/09* | (2012.01) | |
| *G06N 20/00* | (2019.01) | |

(52) U.S. Cl.
CPC .............. *G06F 30/15* (2020.01); *G06F 30/20* (2020.01); *B60W 30/085* (2013.01); *B60W 30/09* (2013.01); *G06N 20/00* (2019.01)

(58) Field of Classification Search
CPC ......... G06F 30/15; G06F 30/20; G06N 20/00; B60W 30/085; B60W 30/09
See application file for complete search history.

(56) References Cited

U.S. PATENT DOCUMENTS

| | | |
|---|---|---|
| 8,612,107 B2 | 12/2013 | Malikopoulos |
| 9,451,899 B2 | 9/2016 | Ritchey et al. |

(Continued)

OTHER PUBLICATIONS

Andersson Eurenius, C. and Cortinas, J.D., 2015. Validation of a Moving Base Driving Simulator for Subjective Assessments of Steering and Handling. (Year: 2015).*

(Continued)

*Primary Examiner* — Chuen-Meei Gan
(74) *Attorney, Agent, or Firm* — Schwegman Lundberg & Woessner, P.A.

(57) ABSTRACT

Systems and techniques for simulated vehicle operation modeling with real vehicle profiles are described herein. In an example, a simulated vehicle modeling system is adapted to obtain a vehicle performance fingerprint, such as from a vehicle performance fingerprint that includes vehicle performance data collected from a unique vehicle while experiencing real world driving conditions. The simulated vehicle modeling system may be further adapted to present, in a driving simulator, a simulated driving experience with a simulated vehicle, such as for a simulated vehicle that is constructed based on the vehicle performance fingerprint. The simulated vehicle modeling system may be further adapted to update a set of driving directives for an autonomous vehicle based on the simulated driving experience and upload the set of driving directive to an autonomous vehicle.

22 Claims, 7 Drawing Sheets

(56) References Cited

U.S. PATENT DOCUMENTS

| | | |
|---|---|---|
| 10,108,191 B2 | 10/2018 | Pilluti et al. |
| 10,437,247 B2 | 10/2019 | Patel et al. |
| 10,607,134 B1 | 3/2020 | Cosic |
| 11,048,832 B2 | 6/2021 | Alvarez et al. |
| 2014/0201126 A1 | 7/2014 | Zadeh et al. |
| 2017/0305434 A1 | 10/2017 | Ratnasingam |
| 2017/0355377 A1 | 12/2017 | Vijaya Kumar et al. |
| 2018/0046869 A1 | 2/2018 | Cordell et al. |
| 2018/0050698 A1 | 2/2018 | Polisson et al. |
| 2018/0136651 A1* | 5/2018 | Levinson ............. G05D 1/0027 |
| 2018/0182185 A1 | 6/2018 | Tong et al. |
| 2018/0259956 A1 | 9/2018 | Kawamoto |
| 2018/0284774 A1 | 10/2018 | Kawamoto |
| 2019/0049948 A1 | 2/2019 | Patel et al. |
| 2019/0050520 A1 | 2/2019 | Alvarez et al. |
| 2019/0072968 A1* | 3/2019 | Will, IV ............. G08G 1/0112 |
| 2019/0213429 A1 | 7/2019 | Sicconi et al. |
| 2019/0370671 A1 | 12/2019 | Martinez Canedo et al. |
| 2020/0057487 A1 | 2/2020 | Sicconi et al. |
| 2020/0218941 A1 | 7/2020 | Wang et al. |

OTHER PUBLICATIONS

"U.S. Appl. No. 15/869,313, Non Final Office Action mailed May 29, 2020", 13 pgs.

"U.S. Appl. No. 15/869,313, Response filed Aug. 28, 2020 to Non Final Office Action mailed May 29, 2020", 12 pgs.

"U.S. Appl. No. 15/869,313, Final Office Action mailed Nov. 19, 2020", 21 pgs.

"U.S. Appl. No. 15/869,313, Response filed Feb. 19, 2021 to Final Office Action mailed Nov. 19, 2020", 11 pgs.

"U.S. Appl. No. 15/869,313, Notice of Allowance mailed Mar. 3, 2021", 6 pgs.

* cited by examiner

```xml
<?xml version="1.0" encoding="UTF-16"?>
<VehicleSettings xmlns:xsd="http://www.w3.org/2001/XMLSchema" xmlns:xsi="http://www.w3.org/2001/XMLSchema-instance">
    <Mass>3100</Mass>                                      405
    <FWD>false</FWD>
    <RWD>true</RWD>                                        420
    <AirDragCoeff>1</AirDragCoeff>
    <AirDownForceCoeff>2</AirDownForceCoeff>
    <TireDragCoeff>4</TireDragCoeff>
    <MaxMotorTorque>450</MaxMotorTorque>
    <MinRPM>800</MinRPM>                                   410
    <MaxRPM>8299</MaxRPM>
    <ShiftDelay>0.7</ShiftDelay>
    <ShiftTime>0.4</ShiftTime>
    <FrontBrakeBias>0.6</FrontBrakeBias>
    <RearBrakeBias>0.4</RearBrakeBias>                     425
    <MaxBrakeTorque>3000</MaxBrakeTorque>
    <ForwardFrictionStiffness>1.4</ForwardFrictionStiffness>
    <SidewaysFrictionStiffness>1.2</SidewaysFrictionStiffness>
    <MaxSteeringAngle>25</MaxSteeringAngle>                415
```

SIMULATED VEHICLE OPERATION MODELING WITH REAL VEHICLE PROFILES

PRIORITY APPLICATION

This application is a continuation of U.S. application Ser. No. 15/869,313, filed Jan. 12, 2018, which is incorporated herein by reference in its entirety.

TECHNICAL FIELD

Embodiments described herein generally relate to simulated vehicle operation modeling with real vehicle profiles and, in some embodiments, more specifically to training an autonomous vehicle.

BACKGROUND

Driving simulators may be used to recreate, in a controlled environment, situations that are either too dangerous for real-life or too costly to reproduce. Driving simulators may test the human experience of an automotive technology in process of development.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 4 illustrates an example section of an XML file representing data for a vehicle performance fingerprint, according to some embodiments.

DETAILED DESCRIPTION

Figure 1:
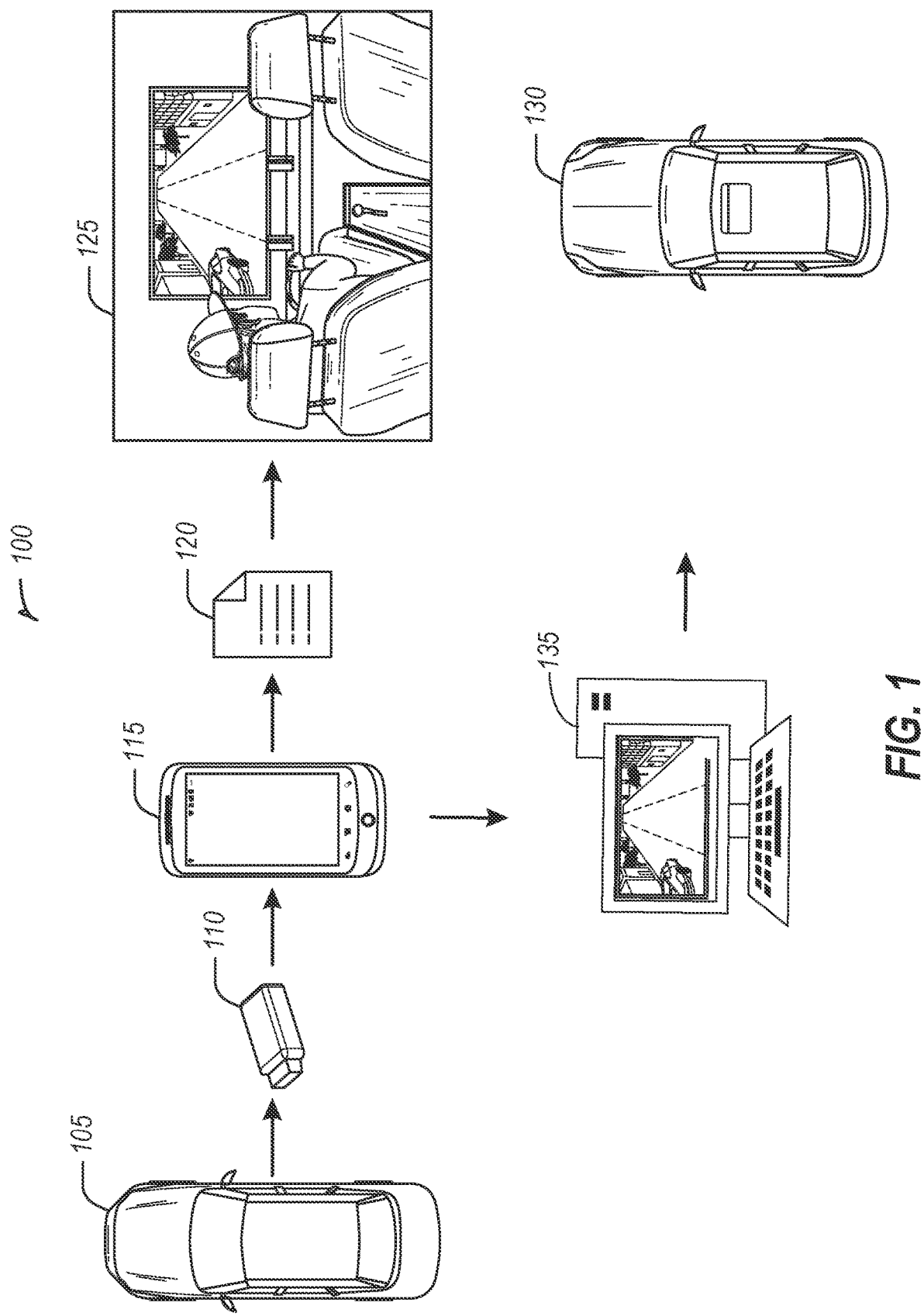
FIG. 1 is an example data flow diagram of a system for simulated vehicle operation modeling with real vehicle profiles, according to an embodiment.

When constructing a simulated vehicle for a simulation, the construction parameters may utilize idealized specifications as provided by the manufacturer. A first kind of driving simulator may look at user metrics in manual and autonomous driving scenarios. A second kind of driving simulator may look at scaling the training of driving policies based on machine learning techniques. This technique is known as software in the loop (SIL). SIL testing, is a test methodology where executable code, such as algorithms, are tested within a modelling environment that can help prove or test the software. Both use cases have a similar drawback in that they fail to recreate the vehicle behavior of a real, and specific car.

The systems and methods described herein capture real vehicle driving performance data over time, generate a vehicle driving profile, and import the profile data into a driving simulator to customize vehicle physics performance in a simulator. The vehicle driving profile is generated by reading real automobile performance parameters over a period of time and producing a data file that may be imported as a vehicle configuration inside a driving simulator.

The systems and methods herein may be used, for example, for generating immersive and realistic experiences where a human participant drives a car to provide feedback for automotive technology. A participant's vehicle profile may be imported into the driving simulator to reproduce a familiar vehicle behavior minimizing the adaptation time for the participant to the simulator and enhancing the immersive experience based on expected vehicle behavior.

The systems and methods herein may be used for realistic, and thus more accurate, vehicle models for SIL or machine learning simulation. The systems and methods herein provide a mechanism to train driving policies that govern vehicle actuation on vehicle profiles that are not manufacturer estimates or generic vehicle models. Rather, vehicle profiles are specific profiles obtained from real vehicles. The systems and methods herein may support customization of machine learning models to vehicles in varying lifecycle states, e.g., brand new, recently purchased, or 10-year-old model; as well as varying vehicle maintenance conditions. The use of up-to-date vehicle profiles may have an impact on the personalization of artificial intelligence (AI) policies for autonomous vehicles. This technique may serve as forensic (post facto) analysis of AI policies for particular environments.

The systems and methods herein provide a mechanism to import the vehicle performance fingerprint of a real vehicle by reading controller area network (CAN) messages from a particular car over time and mapping those values to configuration parameters used in a driving simulator. The vehicle performance fingerprint may be used to create vehicle physics models and to customize responses to control interfaces (e.g., acceleration, brakes, or steering) in the driving simulator. A vehicle physics model may include kinematic and dynamic models. For example, the vehicle performance fingerprint file may be imported by the simulator's engine and used to mimic the real vehicle driving behavior and responses to control input.

This technique may play a role in the post-facto or forensic investigation of accidents, including accidents involving autonomous vehicles, and future prevention of an accident. A simulator may be loaded with a similar environment as the accident with variables that lead to the accident and the latest vehicle performance fingerprint of the particular vehicle. Engineers may identify the root cause of the failure and respond. The response may involve actions including, but not limited to updating autonomous driving policies, issuing a recall, or the like.

This technique provides realism and variability in driving simulators vehicle models used for training machine learning policies for automated vehicles. A generic control policy may be trained using an estimated model. This technique provides for optimizations for different vehicles by loading an up-to-date performance snapshot of a particular vehicle and retraining the control policies. Capturing information for a vehicle at different stages of its lifetime may allow for customization of machine learning models to vehicles over their lifetime.

As described above, driving simulators may be used for a variety of situations, including testing the capabilities of a vehicle, training a person to drive, re-creating scenarios such as an accident, and developing directives for autonomous vehicles. By utilizing vehicle characteristic data collected over a period of time, including specific roadways or scenarios, the simulator may create a more realistic simulated vehicle and driving experience than one with idealized or exemplary vehicle characteristics, such as data provided by the manufacturer.

As autonomous vehicle driving systems are developed, data based on idealized or exemplary vehicle characteristics may prove to be inaccurate for some vehicles. A new autonomous vehicle may have characteristics similar to that of an exemplary vehicle, but when the autonomous vehicle is five years old, the characteristics may differ greatly. The system described herein may collect data from real world vehicles, such as vehicle models used for autonomous vehicles, to capture characteristics of a vehicle at different vehicle life stages in different environmental scenarios to determine driving directives for the autonomous vehicle as it reaches those stages and encounters similar scenarios. Data may be collected from autonomous vehicles, such as when an autonomous vehicle is in an accident or encounters a hazard, and then a simulator may recreate the incident with the performance characteristics of the autonomous vehicle. The re-creation with the real world performance characteristics of the autonomous vehicle may allow engineers to understand how the autonomous vehicle performed and how to improve the driving directives for when a similar incident is encountered.

The techniques described herein discuss a vehicle, such as an automobile, operating in conventional vehicle environments, such as a roadway. Other example vehicles include trucks, motorcycles, buses, or the like. The techniques may be applied to vehicles that operate in other environments, such as air or sea. Thus, the techniques described herein, may be applicable to vehicles such as boats, planes, unmanned aerial vehicles (UAV), helicopters, ships, or trains, all of which may have the techniques applied for autonomous operation.

FIG. 1 is an example data flow diagram 100 of a system for simulated vehicle operation modeling with real vehicle profiles, according to an embodiment. A vehicle 105 may be equipped with a data collection device 110, such as a CAN message reader which connects to a vehicle through an on board diagnostics (OBD) interface. The data collection device 110 may be integrated into existing vehicle components, such as the in-vehicle infotainment (IVI) system or the advanced driver assistance system (ADAS), which may be a part of the CAN. The data collection device 110 may be software running on the electronic control unit (ECU) of the IVI, ADAS or similar vehicle computer system. The vehicle 105 is driven to collect data about the performance of the vehicle 105. The vehicle 105 may be driven in a manner of everyday use. The vehicle 105 may be driven in specific scenarios or repeatedly along a predetermined course. The data collection device 110 may be programmed to collect performance data from the vehicle 105 at a range of time intervals, such as every 30 seconds, every 5 minutes, or every hour. The data collection device 110 may collect data based on the actions of the vehicle 105, such as collecting data each time the vehicle 105 is started.

When the data collection device 110 interfaces with the OBD, it may extract a vehicle performance profile based on correlation functions across engine speed, wheel speed, vehicle speed, and pedal and steering wheel position messages. The data collected from the data collection device 110 through the OBD may include performance data, such as the minimum and maximum rotations per minute (RPM) of the engine, the maximum steering radius, the front and rear brake bias, the maximum brake torque, and the shift time. The data collected may include operating conditions for the vehicle, such as the tire pressure, the oil level, and brake pad wear. The data collected may include vehicle characteristics, such as the make and model, the type of tires, front or rear wheel drive, and the weight of the vehicle.

The data collected by the data collection device 110 may be transferred to a computing device 115 (e.g., a mobile device, such as a smartphone). The computing device may be software integrated into one of the vehicle's computer systems with access to the Telematic Control Unit to upload data collected from a driving performance. The data may be transferred wirelessly (e.g., Bluetooth, Wi-Fi) or through a direct wired connection (e.g., universal serial bus (USB), USB-C, Ethernet, etc.). The computing device 115 may format the collected data into a vehicle performance fingerprint 120. As an example, the vehicle performance fingerprint 120 is a set of data unique to the vehicle. The vehicle performance fingerprint 120 may be organized into a compatible format for other computer systems, such as a driving simulator 125. The format may be a universal format, such as Extensible Markup Language (XML).

The computing device 115 may construct a vehicle performance fingerprint 120, a driver profile, and a vehicle specification, where the vehicle specification may be identified by the vehicle identification number (VIN). The vehicle performance fingerprint 120 may be a single collection of performance data or may include multiple instances of performance data, designated by a time stamp or sequence number. The driver profile may be based on steering wheel and pedal position message deltas correlated with a global positioning system (GPS), forward acceleration, and lateral acceleration.

The vehicle performance fingerprint 120 may be transferred to a simulator, such as a driving simulator 125 or a software simulator 135. The driving simulator 125 may be a simulator for a person to operate and drive the simulated vehicle. The software simulator 135 may be a simulator for testing the driving directives of an autonomous vehicle 130. The driving simulator 125 or software simulator 135 may construct a simulated vehicle based on the vehicle performance fingerprint 120. The simulated vehicle constructed by the driving simulator 125 or software simulator 135 may perform simulated actions based on the data included in the vehicle performance fingerprint 120. The driving directives for the autonomous vehicle 130 may be loaded into the software simulator 135 and tasked with controlling the simulated vehicle constructed from the vehicle performance fingerprint 120. This may be utilized to determine how the autonomous vehicle 130 driving directives function with the performance specifications of a real world vehicle 105, including a vehicle at different stages of its lifespan. When the driving directives have been updated, the modified driving directives may be uploaded to the autonomous vehicle 130 for use.

Figure 2:
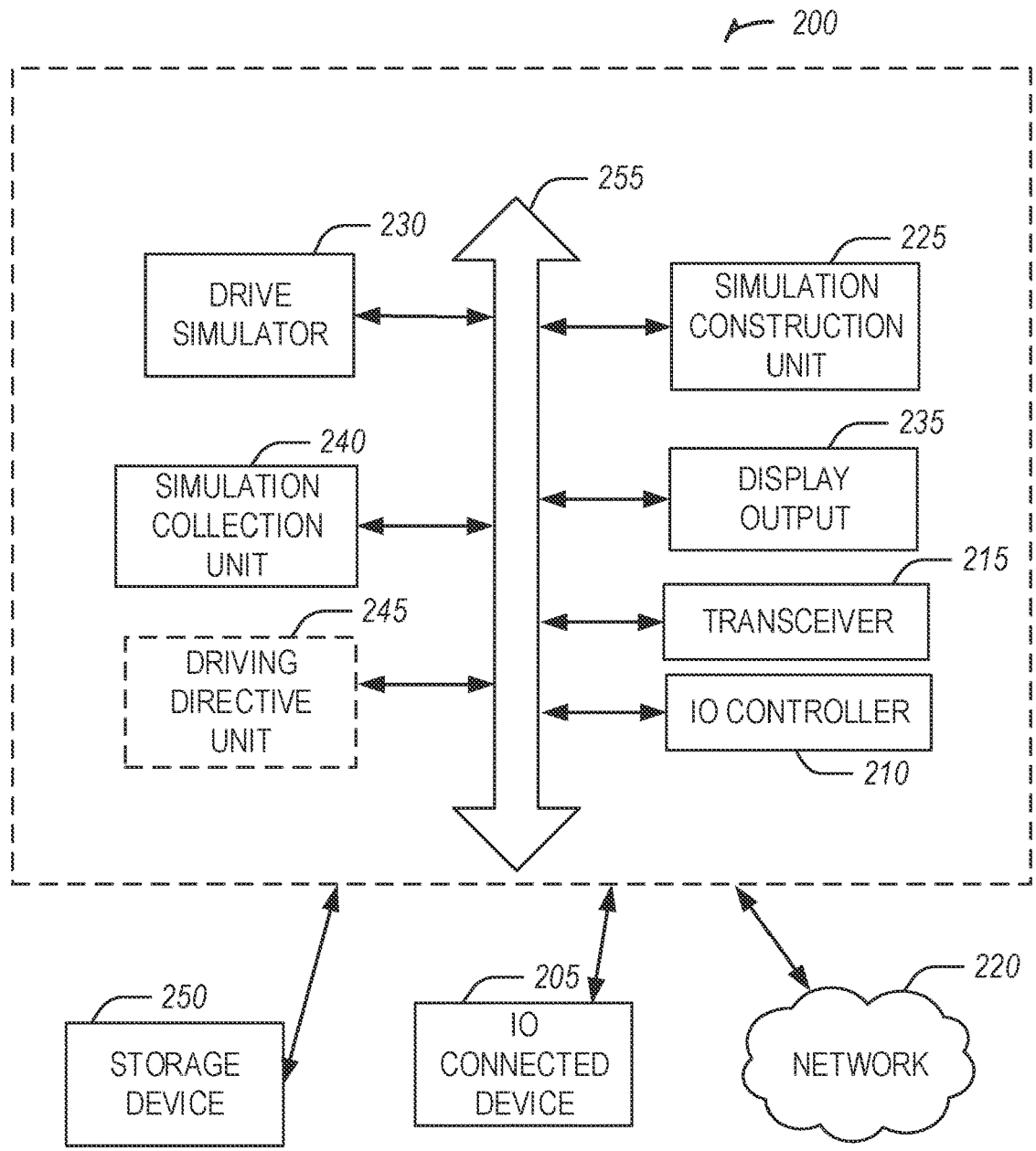
FIG. 2 illustrates a simulation engine for simulated vehicle operation modeling with real vehicle profiles, according to an embodiment.

FIG. 2 illustrates a simulation engine 200 for simulated vehicle operation modeling with real vehicle profiles, according to an embodiment. In an embodiment the simulation engine 200 may receive a vehicle performance fingerprint through an input/output (IO) connected device 205. An IO controller 210 may initiate a transfer of data from the IO connected device 205 to receive the vehicle performance fingerprint. The simulation engine 200 may have a transceiver 215 to receive data transferred through a network 220.

Whether received through the IO controller 210 or transceiver 215, data, including the vehicle performance fingerprint, vehicle profile, and driver profile, is received at the simulation construction unit 225. In an embodiment, the simulation engine 200 may have a communication medium 255 (e.g., bus, link, backplane, interconnect, etc.) for the elements of the simulation engine 200 to communicate with one and other. The simulation construction unit 225 may utilize the vehicle performance fingerprint data to build a simulated version of the vehicle. The simulation construction unit 225 may build different versions of the vehicle based on the vehicle performance fingerprints received. For example, the simulation construction unit 225 may receive a vehicle performance fingerprint for each month of the year and construct a set of separate simulated vehicles for each month. Engineers may use the set of simulated vehicles in the simulator to detect changes to the performance and handling of the vehicle as time progresses. This type of information may be utilized to adjust the driving directives for an autonomous vehicle as the autonomous vehicle is driven.

The simulation engine 200 may receive user input, such as through an IO connected device 205 (e.g., a keyboard) via the IO controller 210, to change values in the vehicle performance fingerprint and alter the construction of the simulated vehicle constructed by the simulation construction unit 225. For example, after performing simulations with the simulated vehicle, a testing engineer may wish to determine the effects of altering the specifications for the simulated vehicle. This may be done to assist in determining what alterations may be made to the vehicle so that is may handle and perform better. For example, it may be determined that increasing the turning radius for the simulated vehicle results in better handling. This information may then be used in the manufacture of new vehicles or by a technician to update a target vehicle for performance improvements.

The simulation construction unit 225 may receive data describing an environment and roadway to construct a simulated environment. This data may be manufactured for the purposes of running a simulation or may be taken from a real world environment for recreation in the simulator. The simulation construction unit 225 may receive input from a user to alter the environment. For example, a user may wish to change the condition of the road or add hazards to the simulation environment.

The drive simulator 230 receives the constructed simulation vehicle and simulated environment from the simulation construction unit 225. The simulation construction unit 225 may provide secondary simulated aspects such as additional vehicles on the road. The drive simulator 230 performs the simulated drive using the simulated vehicle and simulated environment to present the simulated experience to a user of the simulator via the display output 235. The user of the simulator may control the simulated vehicle, such as with a steering wheel and pedals. The input from the controls is received by drive simulator 230, via the IO controller 210, where the inputs are translated to control of the simulated vehicle. The effect of the translated controls on the simulated vehicle are presented to the user through the display output 235.

When a simulation is performed, data may be recorded about simulated performance of the simulated vehicle. The data for the simulation may be gathered by the simulation collection unit 240. This data may include the vehicle performance finger print, the simulated vehicle constructed from the vehicle performance fingerprint, the actions performed during the simulation, and the performance of the simulated vehicle during the simulation. The simulation collection unit 240 may process and analyze this data to then present information about the simulation to the user through the display output 235. The simulation collection unit 240 may send the data to a storage device 250.

The simulation engine 200 may have a driving directive unit 245 for autonomous vehicle control. It may be desired to test the driving directives for an autonomous vehicle by having it run a simulation. The driving directives may be stored on a storage device 250. Instead of a user controlling the simulated vehicle during a simulation, the drive simulator 230 may receive input for controlling the simulated vehicle from the driving directive unit 245.

As an example scenario, a vehicle may be driven along a designated section of a real world roadway. Data may be collected for the real world environment of that roadway. A vehicle performance fingerprint is generated for the vehicle during the time it is driven on the roadway. The vehicle performance fingerprint and environmental data may be received by the simulation construction unit 225 to construct a simulation vehicle based on the vehicle performance fingerprint and a simulation environment representing the section of roadway. The simulation vehicle and simulation environment may be used by the drive simulator 230 to perform a simulation. The input for the simulation may be provided by an autonomous vehicle driving directive from the driving directive unit 245. This may test how well the autonomous vehicle driving directives handle driving on the section of roadway with a vehicle with the same characteristics as the real world vehicle.

Figure 3A:
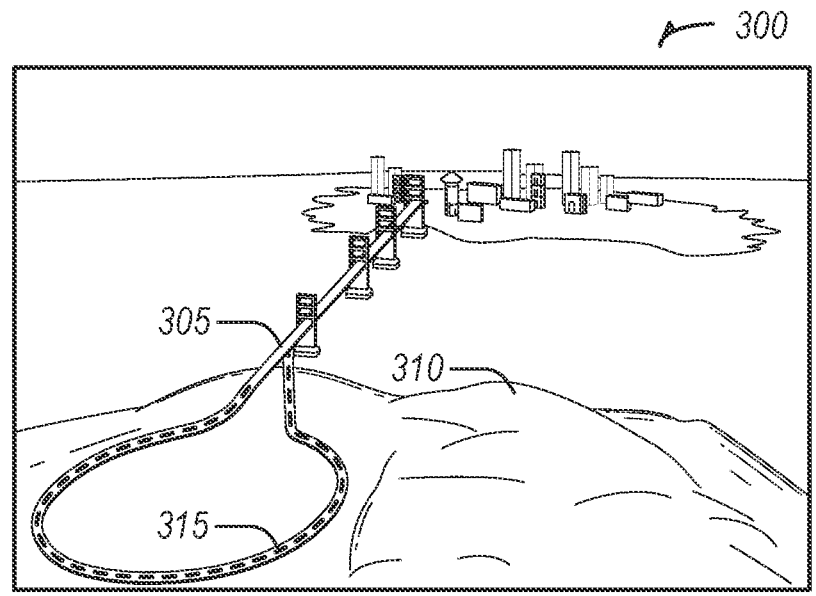
FIG. 3A illustrates an example simulated roadway course, according to an embodiment.
Figure 3B:
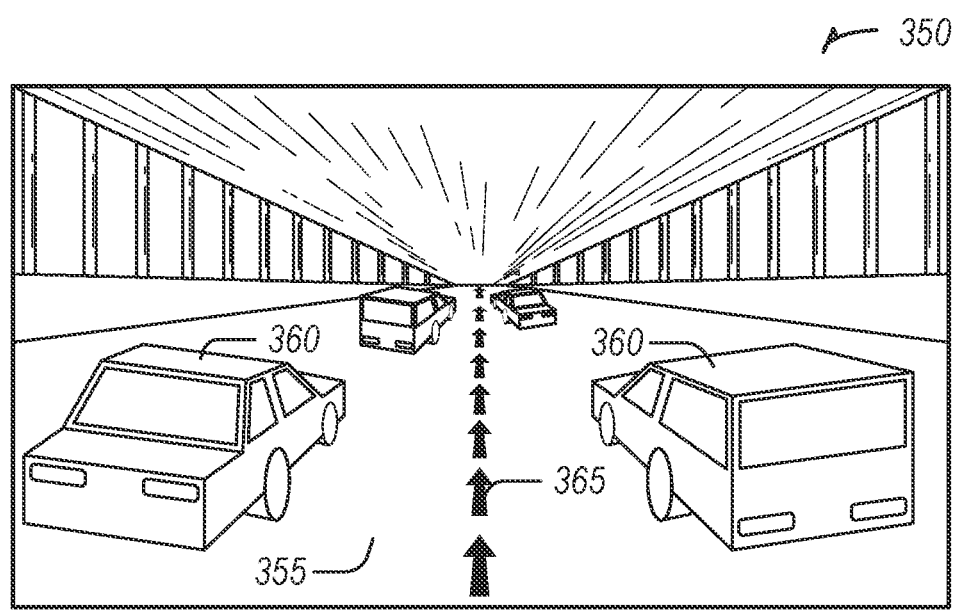
FIG. 3B illustrates a runtime view of a simulation, according to some embodiments.

FIGS. 3A and 3B illustrate an example simulated roadway course 300 and a run-time view of a simulation 350, according to some embodiments. The simulated roadway course 300 is a map including a roadway 305 with terrain 310 and physics. The simulated roadway course 300 may be a fictional course or it may be based on a real world environment. The simulated roadway course 300 may have a drive path 315 designated for a vehicle to follow when performing a simulation. For example, an environment, including elements such as a roadway, terrain, and physics attributes may be created, as a simulated environment, for use in a driving simulator. A course may be mapped along one or more roadways in the simulated environment. When a simulation is conducted with a driving simulator with a person or a software simulator with driving directives for an autonomous vehicle, the vehicle's driver may be instructed to follow the course mapped in the simulated environment.

The run-time view of a simulation 350 illustrates an example view presented by a simulator. The run-time view of a simulation 350 includes a highway 355 with traffic 360. The arrows 365 may be a course for a vehicle path of an autonomous vehicle. The run-time view of a simulation 350 may be similar to a presentation by a driving simulator when conducting a simulation, either with a person or autonomous vehicle driving directives as the driver. Utilizing a vehicle performance fingerprint for the simulation vehicle, a presentation such as the run-time view of a simulation 350, may be used to observe how a real-world vehicle matching the vehicle performance fingerprint handles.

A driving simulator may have multiple vehicle models for the simulator to use as the vehicle being driven or the other vehicles on the road in the simulation. The vehicle models may be modified by the vehicle performance fingerprint. The vehicle models may be loaded into a particular map and terrains and engage in realistic animations vehicle dynamics and traffic. The simulator may have a physics engine to recreate realistically the interactions that may happen in the real world by applying multiple forces, such as friction forces, that have an impact on how vehicles perform upon control inputs. For example, friction forces such as road friction, wind friction, gravity, and drag may be modified. Environmental forces such as light and temperature may be modified.

The forces may be applied to individual components of the simulated vehicle utilizing abstractions, such as rigid bodies (e.g., to simulate a force that happens on objects with mass), colliders (e.g., to detect interactions between objects), and animation curves (e.g., for internal force modelling such as engine load, brakes, and torque modeling). Modifying these parameters may have a direct impact on the simulated car's driving, braking, and steering capabilities, and may represent the actual performance of a vehicle with such forces my utilizing the vehicle performance fingerprint.

FIG. 4 illustrates an example section of an XML file 400 representing data for a vehicle performance fingerprint, according to some embodiments. The data for a vehicle performance fingerprint may be translated into any format that may be processed by a simulator. XML is a common format for categorizing data and that may be interpreted by different types of computing systems. A vehicle performance fingerprint, such as XML file 400, may include data about the performance of the vehicle, such as the weight of the vehicle 405, maximum RPM 410, and the maximum steering angle 415. The XML file 400 may include data calculated from performance data, such as the air drag coefficient 420 and maximum brake torque 425.

A computing device, such as a laptop computer or smartphone, may connect to a vehicle data collection device and generate the vehicle performance fingerprint. The computing device and data collection device may be internal to the vehicle, such as the vehicle's in-vehicle infotainment (IVI) system or onboard safety system, to generate the vehicle performance fingerprint, such as by connecting directly to the OBD system. The data collection device may transfer data wirelessly, such as by a Bluetooth connection, or by a wired connection to the computing device. The data collection device may connect to a vehicle's internal computer, such as the OBD system. The data collection device may be an OBD dongle, such as a BAFX Bluetooth OBDII Reader, with the capability to read and transmit CAN messages.

The data collection device, when connected to the vehicle, may extract vehicle specifications. The data collection device may extract a vehicle performance profile based on correlation functions across engine speed, wheel speed, vehicle speed, and pedal and steering wheel position messages. The data collection device may extract a driver profile based on steering wheel and pedal position message deltas correlated with GPS data, forward acceleration, and lateral acceleration. The data collection device may extract vehicle configuration parameters such as traction mode (e.g., front wheel drive, rear wheel drive, all-wheel drive) and the initial vehicle mass that may be correlated for cargo mass deltas based on velocity changes and momentum changes.

Reading CAN messages from the vehicle related to a performance profile over a period of time allows for the capture of parameter values, such as minimum and maximum RPM values. Reading CAN messages may provide data to validate a particular vehicle's engine performance function, such as the RPM Curve. Other parameters, such as vehicle torque and brake torque are derivatives of a formula. For example: vehicleTorque=rpmCurve. Evaluate (currentRPM maxRPM)*gearRatio*finalDriveRatio*tractionControlAdjustedMaxTorque and brakeTorque=maxBrakeTorque*brakeInput*-1*axle. brakeBias. Formulas may be used by the computing device to calculate data required by the simulator from the data of the CAN messages captured by the data collection device.

The computing device may extract data to generate a driver profile which contains information on the driving style of the person operating the vehicle. This may be used to modify or influence the autonomous driving policies in the simulator to then mimic the operator's driving style.

Figure 5A:
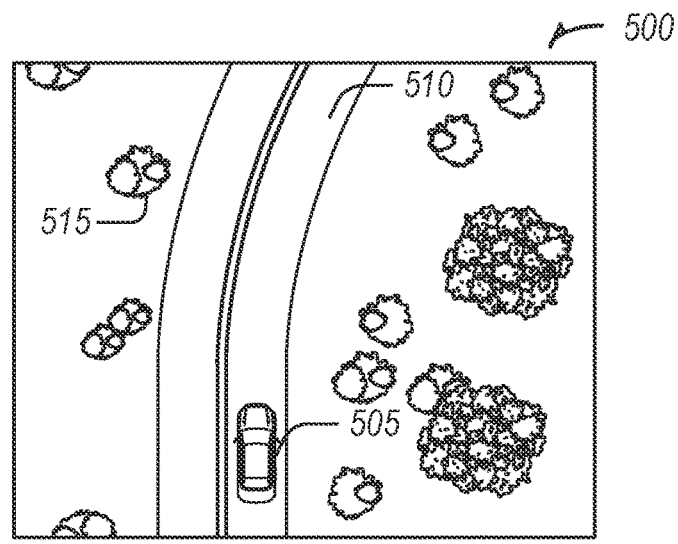
FIGS. 5A-5C illustrate a scenario where a real world situation may be translated and modified to a simulation and then applied back to a real world situation, according to some embodiments.
Figure 5B:
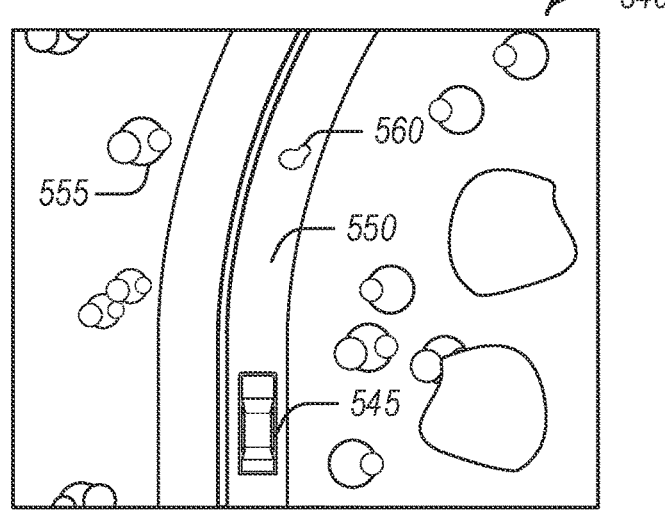
Figure 5C:
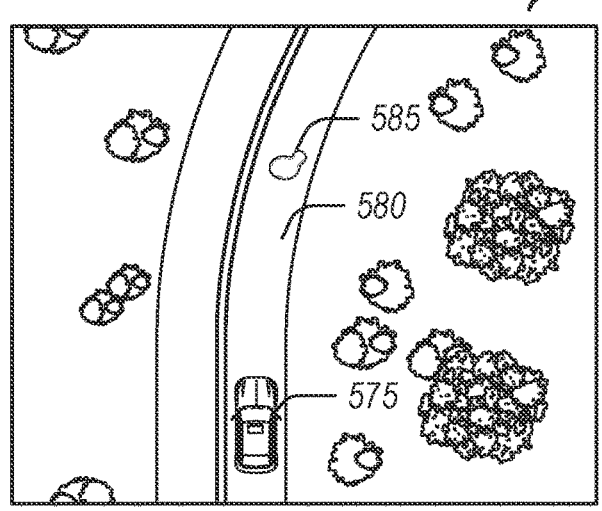

FIGS. 5A-5C illustrate a scenario where a real world situation may be translated and modified to a simulation and then applied back to a real world situation, according to some embodiments. FIG. 5A illustrates a real world driving scenario 500 with a vehicle 505 driving along a roadway 510. The performance of the vehicle 505 may be captured by the OBD system and translated to a vehicle performance fingerprint. Data may be collected to reproduce the environment 515 and roadway 510 in a simulator. This may include the type of roadway, the condition of the roadway, and the path of the roadway (e.g., the curves, turns, inclines, and declines).

FIG. 5B illustrates a simulated driving scenario 540 with a simulated vehicle 545 driving along a simulated roadway 550. The simulated vehicle 545 may be constructed from a vehicle performance fingerprint, such as one generated by vehicle 505. The simulated roadway 550 and simulated environment 555, each respectively constructed from data collected for the roadway 510 and environment 515. For example, a course may be plotted for a vehicle 505 to drive from a ten mile distance along a highway. Data is collected from the OBD system of the vehicle 505 as it drives the course. Data is collected for the roadway and environment along the course. The course path may be gathered from a vehicle tasked with mapping the course or from stored maps. The vehicle performance data and the roadway and environment data for the course are used to construct a simulation, such as simulated driving scenario 540. The simulated driving scenario 540 may be altered to test how a driver or autonomous vehicle may handle different situations. The simulated driving scenario 540 may be used to evaluate the driving performance qualifications of a driver and train driver muscle coordination in driver unknown simulated driving circumstances. Hazards may be added to the simulated driving scenario 540, such as a large pothole 560. In an example, the simulator may test the driving directives for an autonomous vehicle. The driving directives may control the simulated vehicle 545 along a course, such as simulated roadway 550. Hazards, such as pothole 560, may be inserted into the course to determine how the driving directives handle situations. Based on the actions taken by the driving directives to control the simulated vehicle 545 when encountering a hazard, the driving directives may be modified to improve the capabilities of the autonomous vehicle.

FIG. 5C illustrates a real world driving scenario 570 with an autonomous vehicle 575 driving along a roadway 580. Based on testing the driving directives for an autonomous vehicle in a simulator, such as simulated driving scenario 540, the autonomous vehicle 575 may properly handle unexpected real world hazards, such as a pothole 585 in the roadway 580. By utilizing the real world performance data for the vehicle 505 to construct the simulated vehicle 545, a realistic response to hazards may be determined. In an example, the same simulated driving scenario 540 may be conducted using autonomous vehicle driving directives, but utilizing a vehicle performance fingerprint for a three year old vehicle and a six year old vehicle. This may result in determining that the driving directives, such as when encountering a hazard like pothole 585, are different based on the age and other characteristics of the vehicle.

Similar to the scenario presented in FIGS. 5A-5C, the vehicle performance fingerprint may be used to reproduce an accident, such as a driver losing control and the vehicle skidding off the road. Data may be collected for the environment where the accident occurred. This environmental data with the vehicle performance fingerprint may be used in a simulator to recreate the accident. The simulation may be iteratively repeated with certain factors, such as the speed of the vehicle, altered in each iteration to create a simulation that most closely matches the outcome of the actual accident. The data collected from the simulation may then be applied to prevent future accidents. For example, if vehicles frequently lose control around a section of roadway, a simulation may be performed for each of those vehicles to determine the speed of the vehicles. The collected data may then be used to reduce the speed limit for the section of roadway or alter the course of the roadway.

Figure 6:
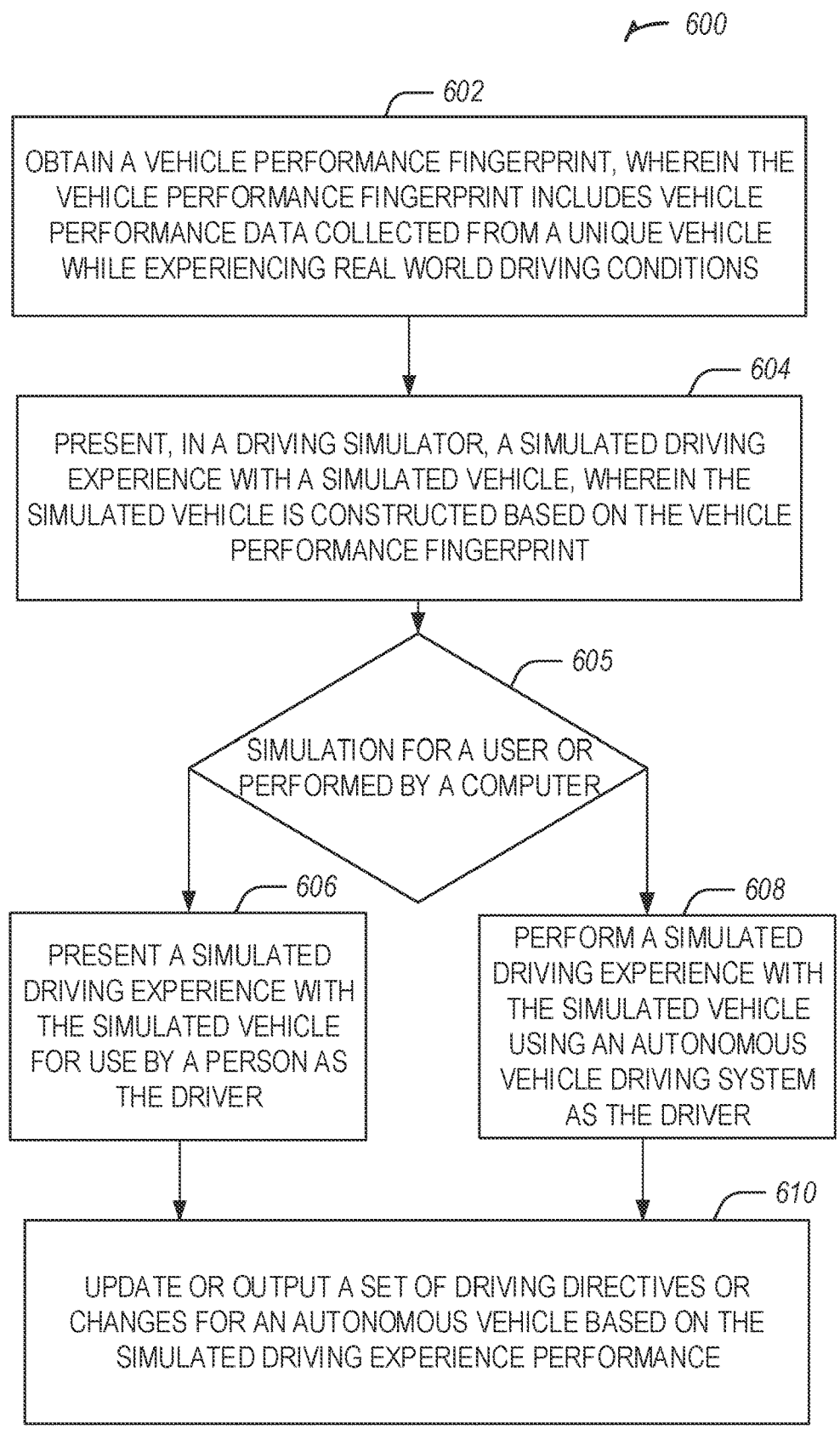
FIG. 6 illustrates a flowchart showing a technique for simulating vehicle operation in accordance with some embodiments.

FIG. 6 illustrates a flowchart showing a technique 600 for simulating vehicle operation in accordance with some embodiments. The technique 600 includes an operation 602 to obtain a vehicle performance fingerprint, wherein the vehicle performance fingerprint includes vehicle performance data collected from a unique vehicle while experiencing real world driving conditions. The technique 600 includes an operation 604 to present, in a driving simulator, a simulated driving experience with a simulated vehicle, wherein the simulated vehicle is constructed based on the vehicle performance fingerprint. The technique 600 may further include a decision 605 wherein the simulation may be presented for a user or performed by a computer, such as for testing the directives of an autonomous vehicle. The operation 606 may present a simulated driving experience with the simulated vehicle for use by a person as the driver of the simulated vehicle. The operation 608 may perform the simulated driving experience with the simulated vehicle using an autonomous vehicle driving system of directives as the driver. The technique 600 may include performing either operation 606 or operation 608, or performing both operations. The technique 600 may further include an operation 610 to update or output a set of driving directives or changes for an autonomous vehicle based on the data collected from the simulated driving experience performance.

In an example, the operation 602 may include vehicle performance data that is collected at predetermined intervals of time. For example, the data may be collected based on time such as at monthly or yearly intervals, or the data may be collected based on events, such as at every oil change or every 10,000 miles on the odometer. In an example, the operation 604 may include modifying the simulated driving experience with at least one of road friction, wind friction, gravity, or drag. In an example, the operation 602 may include the vehicle experiencing real world driving conditions is an autonomous vehicle.

The technique 600 may further include operations to receive environmental data of a real world environment and build a simulated environment based on the environmental data. The environmental data may include a roadway and the conditions of the roadway, including at least one of type of roadway, friction characteristics, or roadway damage. The technique 600 may further include operations to simulate an accident simulation of a real world accident using the simulated environment and the vehicle performance fingerprint, wherein the vehicle performance fingerprint includes the vehicle performance data at the time of the accident and the environmental data includes data for a location of the real world accident. Utilizing the accident simulation, the technique 600 may include an operation to identify a cause of the real world accident.

In an example, the operation 602 may include vehicle performance data which includes data collected from the vehicle driving along a predetermined course and the environmental data includes the predetermined course. The technique 600 may further include an operation to perform the simulated driving experience using the driving directives of an autonomous vehicle on the predetermined course. This operation may include a simulated hazard added to the simulated environment. The technique 600 may further include an operation to train a machine learning model based on responses of the simulated vehicle. For example, the machine learning model may receive input of training data. The training data may be data of a person driving or data of an autonomous vehicle driving in the real world. The machine learning model may use the training data and additional testing data, such as data from a simulation, learn how different situations are handled. The machine learning model may then update and refine the driving directive for an autonomous vehicle. The machine learning model may then output new directives for an autonomous vehicle.

The technique 600 may further include operations to generate a driver profile based on the vehicle performance fingerprint and store, at a storage device, the driver profile. A driver profile may be generated by aggregating vehicle performance data to determine a driver handles situations and performs actions such as accelerating and braking. The operation may include performing the simulated driving experience with the simulated vehicle includes using a previously recorded driver profile. The driver profile may be used to guide the development or modification of the driving directives for an autonomous vehicle.

In an example, the operation 602 to obtain the vehicle performance fingerprint comprises accessing an onboard diagnostic system and obtaining live vehicle operational metrics. Accessing the OBD system includes establishing a wireless connection with the OBD system from a computing device. The wireless connection may be a Bluetooth connection or an 802.11 connection. The live vehicle operational metrics may include at least one of minimum rotations per minute, maximum rotations per minute, vehicle weight, front or rear wheel drive classification, maximum torque, front brake bias, rear brake bias, or maximum steering angle.

In an example, the operation 604 may include storing, at a storage device, the vehicle performance fingerprint and simulated vehicle. The vehicle performance fingerprint and the simulated vehicle are encrypted.

In an example, the operation 604 may include providing force feedback to driving controls based on the vehicle performance fingerprint. The driving controls include at least one of a steering wheel, a brake pedal, or an acceleration pedal.

Figure 7:
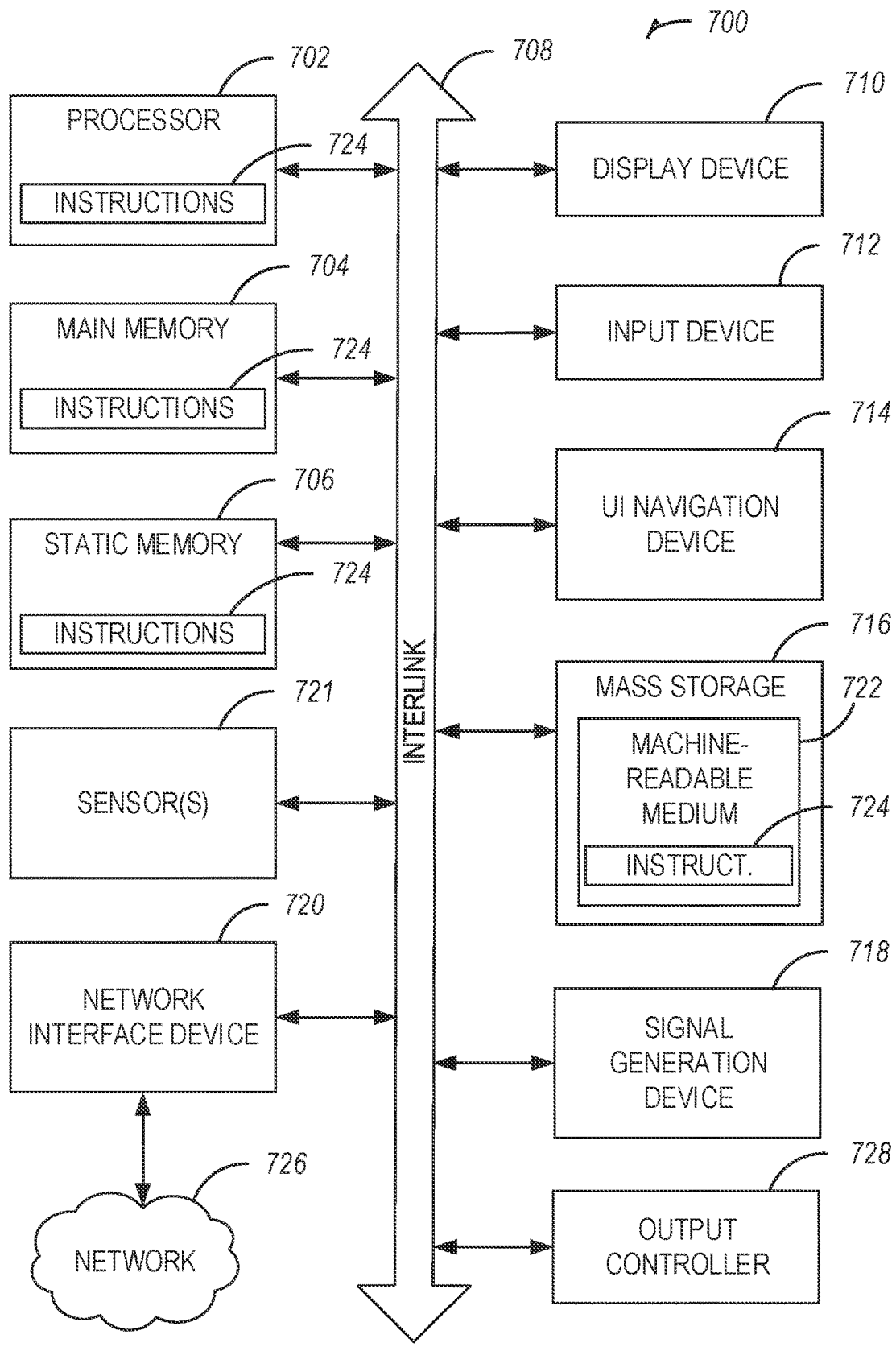
FIG. 7 is a block diagram illustrating an example of a machine upon which one or more embodiments may be implemented.

FIG. 7 illustrates a block diagram of an example machine 700 upon which any one or more of the techniques (e.g., methodologies) discussed herein may perform. In alternative embodiments, the machine 700 may operate as a standalone device or may be connected (e.g., networked) to other machines. In a networked deployment, the machine 700 may operate in the capacity of a server machine, a client machine, or both in server-client network environments. In an example, the machine 700 may act as a peer machine in peer-to-peer (P2P) (or other distributed) network environment. The machine 700 may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuit sets are a collection of circuits implemented in tangible entities that include hardware (e.g., simple circuits, gates, logic, etc.). Circuit set membership may be flexible over time and underlying hardware variability. Circuit sets include members that may, alone or in combination, perform specified operations when operating. In an example, hardware of the circuit set may be immutably designed to carry out a specific operation (e.g., hardwired). In an example, the hardware of the circuit set may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuit set in hardware via the variable connections to carry out portions of the specific operation when in operation. Accordingly, the computer readable medium is communicatively coupled to the other components of the circuit set member when the device is operating. In an example, any of the physical components may be used in more than one member of more than one circuit set. For example, under operation, execution units may be used in a first circuit of a first circuit set at one point in time and reused by a second circuit in the first circuit set, or by a third circuit in a second circuit set at a different time.

Machine (e.g., computer system) 700 may include a hardware processor 702 (e.g., a central processing unit (CPU), a graphics processing unit (GPU), a hardware processor core, field programmable gate array (FPGA), or any combination thereof), a main memory 704 and a static memory 706, some or all of which may communicate with each other via an interlink (e.g., bus) 708. The machine 700 may further include a display unit 710, an alphanumeric input device 712 (e.g., a keyboard), and a user interface (UI) navigation device 714 (e.g., a mouse). In an example, the display unit 710, input device 712 and UI navigation device 714 may be a touch screen display. The machine 700 may additionally include a storage device (e.g., drive unit) 716, a signal generation device 718 (e.g., a speaker), a network interface device 720, and one or more sensors 721, such as a global positioning system (GPS) sensor, compass, accelerometer, or other sensor. The machine 700 may include an output controller 728, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 716 may include a machine readable medium 722 on which is stored one or more sets of data structures or instructions 724 (e.g., software) embodying or utilized by any one or more of the techniques or functions described herein. The instructions 724 may also reside, completely or at least partially, within the main memory 704, within static memory 706, or within the hardware processor 702 during execution thereof by the machine 700. In an example, one or any combination of the hardware processor 702, the main memory 704, the static memory 706, or the storage device 716 may constitute machine readable media.

While the machine readable medium 722 is illustrated as a single medium, the term "machine readable medium" may include a single medium or multiple media (e.g., a centralized or distributed database, and/or associated caches and servers) configured to store the one or more instructions 724.

The term "machine readable medium" may include any medium that is capable of storing, encoding, or carrying instructions for execution by the machine 700 and that cause the machine 700 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices: magnetic disks, such as internal hard disks and removable disks: magneto-optical disks; and CD-ROM and DVD-ROM disks.

The instructions 724 may further be transmitted or received over a communications network 726 using a transmission medium via the network interface device 720 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 720 may include one or more physical jacks (e.g., Ethernet, coaxial, or phone jacks) or one or more antennas to connect to the communications network 726. In an example, the network interface device 720 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 700, and includes digital or analog communications signals or other intangible medium to facilitate communication of such software.

ADDITIONAL NOTES & EXAMPLES

Example 1 is a system for simulating vehicle operation comprising: at least one processor; and memory including instructions that, when executed by the at least one processor, cause the at least one processor to: obtain a vehicle performance fingerprint, wherein the vehicle performance fingerprint includes, vehicle performance data collected from a unique vehicle while experiencing real world driving conditions: and present, in a driving simulator, a simulated driving experience with a simulated vehicle, wherein the simulated vehicle is constructed based on the vehicle performance fingerprint.

In Example 2, the subject matter of Example 1 includes, wherein the vehicle performance data is collected at predetermined intervals of time.

In Example 3, the subject matter of Examples 1-2 includes, instructions to: receive environmental data of a real world environment; and build a simulated environment based on the environmental data.

In Example 4, the subject matter of Example 3 includes, wherein the simulated environment includes roadway conditions including at least one of: a type of roadway, friction characteristics, or roadway damage.

In Example 5, the subject matter of Examples 3-4 includes, instructions to: simulate a real world accident using the simulated environment and the vehicle performance fingerprint, wherein the vehicle performance fingerprint includes the vehicle performance data at the time of the real world accident and the environmental data includes data for a location of the real world accident; and identify a cause of the real world accident.

In Example 6, the subject matter of Examples 3-5 includes, wherein the vehicle performance data includes data collected from the vehicle driving along a predetermined course and the environmental data includes information about the predetermined course.

In Example 7, the subject matter of Example 6 includes, instructions to: perform the simulated driving experience utilizing the driving directives of an autonomous vehicle on the predetermined course.

In Example 8, the subject matter of Example 7 includes, wherein a simulated hazard is added to the simulated environment.

In Example 9, the subject matter of Examples 1-8 includes, instructions to: modify the simulated driving experience with at least one of road friction, wind resistance gravity, or drag.

In Example 10, the subject matter of Examples 1-9 includes, instructions to: generate a driver profile based on the vehicle performance fingerprint; and store, at a storage device, the driver profile.

In Example 11, the subject matter of Example 10 includes, wherein performing the simulated driving experience with the simulated vehicle includes using a previously recorded driver profile.

In Example 12, the subject matter of Examples 1-11 includes, wherein the vehicle experiencing real world driving conditions is an autonomous vehicle.

In Example 13, the subject matter of Examples 1-12 includes, instructions to: train a machine learning model based on responses of the simulated vehicle.

In Example 14, the subject matter of Examples 1-13 includes, wherein obtaining the vehicle performance fingerprint comprises: access an onboard diagnostic system: and obtain live vehicle operational metrics from the onboard diagnostic system.

In Example 15, the subject matter of Example 14 includes, wherein accessing the onboard diagnostic system comprises: establish a wireless connection with the onboard diagnostic system from a computing device.

In Example 16, the subject matter of Example 15 includes, wherein the wireless connection is a Bluetooth connection.

In Example 17, the subject matter of Examples 15-16 includes, wherein the wireless connection operates in accordance with a standard from an IEEE 802.11 family of standards.

In Example 18, the subject matter of Examples 14-17 includes, wherein the live vehicle operational metrics include at least one of minimum rotations per minute, maximum rotations per minute, vehicle weight, front or rear wheel drive classification, maximum torque, front brake bias, rear brake bias, or maximum steering angle.

In Example 19, the subject matter of Examples 1-18 includes, instruction to: store, on a storage device, the vehicle performance fingerprint and data representing the simulated vehicle.

In Example 20, the subject matter of Example 19 includes, wherein the vehicle performance fingerprint and the simulated vehicle are encrypted.

In Example 21, the subject matter of Examples 1-20 includes, wherein presenting the simulated driving experience comprises: providing force feedback to one or more driving controls based on the vehicle performance fingerprint.

In Example 22, the subject matter of Example 21 includes, wherein the driving controls include at least one of a steering wheel, a brake pedal, or an acceleration pedal.

Example 23 is at least one computer readable medium including instructions for simulating vehicle operation that when executed by at least one processor, cause the at least one processor to: obtain a vehicle performance fingerprint, wherein the vehicle performance fingerprint includes, vehicle performance data collected from a unique vehicle while experiencing real world driving conditions: and present, in a driving simulator, a simulated driving experience with a simulated vehicle, wherein the simulated vehicle is constructed based on the vehicle performance fingerprint.

In Example 24, the subject matter of Example 23 includes, wherein the vehicle performance data is collected at predetermined intervals of time.

In Example 25, the subject matter of Examples 23-24 includes, instructions to: receive environmental data of a real world environment; and build a simulated environment based on the environmental data.

In Example 26, the subject matter of Example 25 includes, wherein the simulated environment includes roadway conditions including at least one of: a type of roadway, friction characteristics, or roadway damage.

In Example 27, the subject matter of Examples 25-26 includes, instructions to: simulate a real world accident using the simulated environment and the vehicle performance fingerprint, wherein the vehicle performance fingerprint includes the vehicle performance data at the time of the real world accident and the environmental data includes data for a location of the real world accident; and identify a cause of the real world accident.

In Example 28, the subject matter of Examples 25-27 includes, wherein the vehicle performance data includes data collected from the vehicle driving along a predetermined course and the environmental data includes information about the predetermined course.

In Example 29, the subject matter of Example 28 includes, instructions to: perform the simulated driving experience utilizing the driving directives of an autonomous vehicle on the predetermined course.

In Example 30, the subject matter of Example 29 includes, wherein a simulated hazard is added to the simulated environment.

In Example 31, the subject matter of Examples 23-30 includes, instructions to: modify the simulated driving experience with at least one of road friction, wind resistance gravity, or drag.

In Example 32, the subject matter of Examples 23-31 includes, instructions to: generate a driver profile based on the vehicle performance fingerprint; and store, at a storage device, the driver profile.

In Example 33, the subject matter of Example 32 includes, wherein performing the simulated driving experience with the simulated vehicle includes using a previously recorded driver profile.

In Example 34, the subject matter of Examples 23-33 includes, wherein the vehicle experiencing real world driving conditions is an autonomous vehicle.

In Example 35, the subject matter of Examples 23-34 includes, instructions to: train a machine learning model based on responses of the simulated vehicle.

In Example 36, the subject matter of Examples 23-35 includes, wherein obtaining the vehicle performance fingerprint comprises: access an onboard diagnostic system; and obtain live vehicle operational metrics from the onboard diagnostic system.

In Example 37, the subject matter of Example 36 includes, wherein accessing the onboard diagnostic system comprises: establish a wireless connection with the onboard diagnostic system from a computing device.

In Example 38, the subject matter of Example 37 includes, wherein the wireless connection is a Bluetooth connection.

In Example 39, the subject matter of Examples 37-38 includes, wherein the wireless connection operates in accordance with a standard from an IEEE 802.11 family of standards.

In Example 40, the subject matter of Examples 36-39 includes, wherein the live vehicle operational metrics include at least one of minimum rotations per minute, maximum rotations per minute, vehicle weight, front or rear wheel drive classification, maximum torque, front brake bias, rear brake bias, or maximum steering angle.

In Example 41, the subject matter of Examples 23-40 includes, instruction to: store, on a storage device, the vehicle performance fingerprint and data representing the simulated vehicle.

In Example 42, the subject matter of Example 41 includes, wherein the vehicle performance fingerprint and the simulated vehicle are encrypted.

In Example 43, the subject matter of Examples 23-42 includes, wherein presenting the simulated driving experience comprises: providing force feedback to one or more driving controls based on the vehicle performance fingerprint.

In Example 44, the subject matter of Example 43 includes, wherein the driving controls include at least one of a steering wheel, a brake pedal, or an acceleration pedal.

Example 45 is a method for simulating vehicle operation comprising: obtaining a vehicle performance fingerprint, wherein the vehicle performance fingerprint includes, vehicle performance data collected from a unique vehicle while experiencing real world driving conditions; and presenting, in a driving simulator, a simulated driving experience with a simulated vehicle, wherein the simulated vehicle is constructed based on the vehicle performance fingerprint.

In Example 46, the subject matter of Example 45 includes, wherein the vehicle performance data is collected at predetermined intervals of time.

In Example 47, the subject matter of Examples 45-46 includes, receiving environmental data of a real world environment; and building a simulated environment based on the environmental data.

In Example 48, the subject matter of Example 47 includes, wherein the simulated environment includes roadway conditions including at least one of: a type of roadway, friction characteristics, or roadway damage.

In Example 49, the subject matter of Examples 47-48 includes, simulating a real world accident using the simulated environment and the vehicle performance fingerprint, wherein the vehicle performance fingerprint includes the vehicle performance data at the time of the real world accident and the environmental data includes data for a location of the real world accident; and identifying a cause of the real world accident.

In Example 50, the subject matter of Examples 47-49 includes, wherein the vehicle performance data includes data collected from the vehicle driving along a predetermined course and the environmental data includes information about the predetermined course.

In Example 51, the subject matter of Example 50 includes, performing the simulated driving experience utilizing the driving directives of an autonomous vehicle on the predetermined course.

In Example 52, the subject matter of Example 51 includes, wherein a simulated hazard is added to the simulated environment.

In Example 53, the subject matter of Examples 45-52 includes, modifying the simulated driving experience with at least one of road friction, wind resistance gravity, or drag.

In Example 54, the subject matter of Examples 45-53 includes, generating a driver profile based on the vehicle performance fingerprint; and storing, at a storage device, the driver profile.

In Example 55, the subject matter of Example 54 includes, wherein performing the simulated driving experience with the simulated vehicle includes using a previously recorded driver profile.

In Example 56, the subject matter of Examples 45-55 includes, wherein the vehicle experiencing real world driving conditions is an autonomous vehicle.

In Example 57, the subject matter of Examples 45-56 includes, training a machine learning model based on responses of the simulated vehicle.

In Example 58, the subject matter of Examples 45-57 includes, wherein obtaining the vehicle performance fingerprint comprises: accessing an onboard diagnostic system; and obtaining live vehicle operational metrics from the onboard diagnostic system.

In Example 59, the subject matter of Example 58 includes, wherein accessing the onboard diagnostic system comprises: establishing a wireless connection with the onboard diagnostic system from a computing device.

In Example 60, the subject matter of Example 59 includes, wherein the wireless connection is a Bluetooth connection.

In Example 61, the subject matter of Examples 59-6) includes, wherein the wireless connection operates in accordance with a standard from an IEEE 802.11 family of standards.

In Example 62, the subject matter of Examples 58-61 includes, wherein the live vehicle operational metrics include at least one of minimum rotations per minute, maximum rotations per minute, vehicle weight, front or rear wheel drive classification, maximum torque, front brake bias, rear brake bias, or maximum steering angle.

In Example 63, the subject matter of Examples 45-62 includes, storing, on a storage device, the vehicle performance fingerprint and data representing the simulated vehicle.

In Example 64, the subject matter of Example 63 includes, wherein the vehicle performance fingerprint and the simulated vehicle are encrypted.

In Example 65, the subject matter of Examples 45-64 includes, wherein presenting the simulated driving experience comprises: providing force feedback to one or more driving controls based on the vehicle performance fingerprint.

In Example 66, the subject matter of Example 65 includes, wherein the driving controls include at least one of a steering wheel, a brake pedal, or an acceleration pedal.

Example 67 is a system comprising means to perform any method of Examples 45-66.

Example 68 is at least one machine readable medium including instructions that, when executed by processing circuitry, cause the processing circuitry to perform any method of Examples 45-66.

Example 69 is a system for simulating vehicle operation comprising: means for obtaining a vehicle performance fingerprint, wherein the vehicle performance fingerprint includes, vehicle performance data collected from a unique vehicle while experiencing real world driving conditions; and means for presenting, in a driving simulator, a simulated driving experience with a simulated vehicle, wherein the simulated vehicle is constructed based on the vehicle performance fingerprint.

In Example 70, the subject matter of Example 69 includes, wherein the vehicle performance data is collected at predetermined intervals of time.

In Example 71, the subject matter of Examples 69-70 includes, means for receiving environmental data of a real world environment; and means for building a simulated environment based on the environmental data.

In Example 72, the subject matter of Example 71 includes, wherein the simulated environment includes roadway conditions including at least one of: a type of roadway, friction characteristics, or roadway damage.

In Example 73, the subject matter of Examples 71-72 includes, means for simulating a real world accident using the simulated environment and the vehicle performance fingerprint, wherein the vehicle performance fingerprint includes the vehicle performance data at the time of the real world accident and the environmental data includes data for a location of the real world accident; and means for identifying a cause of the real world accident.

In Example 74, the subject matter of Examples 71-73 includes, wherein the vehicle performance data includes data collected from the vehicle driving along a predetermined course and the environmental data includes information about the predetermined course.

In Example 75, the subject matter of Example 74 includes, means for performing the simulated driving experience utilizing the driving directives of an autonomous vehicle on the predetermined course.

In Example 76, the subject matter of Example 75 includes, wherein a simulated hazard is added to the simulated environment.

In Example 77, the subject matter of Examples 69-76 includes, means for modifying the simulated driving experience with at least one of road friction, wind resistance gravity, or drag.

In Example 78, the subject matter of Examples 69-77 includes, means for generating a driver profile based on the vehicle performance fingerprint: and means for storing, at a storage device, the driver profile.

In Example 79, the subject matter of Example 78 includes, wherein the means for performing the simulated driving experience with the simulated vehicle include using a previously recorded driver profile.

In Example 80, the subject matter of Examples 69-79 includes, wherein the vehicle experiencing real world driving conditions is an autonomous vehicle.

In Example 81, the subject matter of Examples 69-80 includes, means for training a machine learning model based on responses of the simulated vehicle.

In Example 82, the subject matter of Examples 69-81 includes, wherein the means for obtaining the vehicle performance fingerprint include: means for accessing an onboard diagnostic system; and means for obtaining live vehicle operational metrics from the onboard diagnostic system.

In Example 83, the subject matter of Example 82 includes, wherein the means for accessing the onboard diagnostic system include: means for establishing a wireless connection with the onboard diagnostic system from a computing device.

In Example 84, the subject matter of Example 83 includes, wherein the wireless connection is a Bluetooth connection.

In Example 85, the subject matter of Examples 83-84 includes, wherein the wireless connection operates in accordance with a standard from an IEEE 802.11 family of standards.

In Example 86, the subject matter of Examples 82-85 includes, wherein the live vehicle operational metrics include at least one of minimum rotations per minute, maximum rotations per minute, vehicle weight, front or rear wheel drive classification, maximum torque, front brake bias, rear brake bias, or maximum steering angle.

In Example 87, the subject matter of Examples 69-86 includes, means for storing, on a storage device, the vehicle performance fingerprint and data representing the simulated vehicle.

In Example 88, the subject matter of Example 87 includes, wherein the vehicle performance fingerprint and the simulated vehicle are encrypted.

In Example 89, the subject matter of Examples 69-88 includes, wherein the means for presenting the simulated driving experience include: means for providing force feedback to one or more driving controls based on the vehicle performance fingerprint.

In Example 90, the subject matter of Example 89 includes, wherein the driving controls include at least one of a steering wheel, a brake pedal, or an acceleration pedal.

Example 91 is at least one machine-readable medium including instructions that, when executed by processing circuitry, cause the processing circuitry to perform operations to implement of any of Examples 1-90.

Example 92 is an apparatus comprising means to implement of any of Examples 1-90.

Example 93 is a system to implement of any of Examples 1-90.

Example 94 is a method to implement of any of Examples 1-90.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document: for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is to allow the reader to quickly ascertain the nature of the technical disclosure and is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the embodiments should be determined with reference to the appended claims, along with the full scope of equivalents to which such claims are entitled.

What is claimed is:

1. A system for simulating vehicle operation comprising:
   at least one processor; and
   memory including instructions that, when executed by the at least one processor, cause the at least one processor to:
      obtain a vehicle performance fingerprint corresponding to a unique vehicle, wherein the vehicle performance fingerprint includes vehicle characteristics corresponding to data collected from a real-world condition of the unique vehicle;
      provide the vehicle performance fingerprint to an autonomous driving vehicle model, wherein the autonomous driving vehicle model is a trained machine learning model configured to generate a driving policy based on the vehicle performance fingerprint; and
      cause execution of a simulated drive in a driving simulator, the driving simulator configured to simulate performance of the unique vehicle, wherein the simulated drive is customized to the generated driving policy and the real-world condition of the unique vehicle.

2. The system of claim 1, wherein the vehicle characteristics corresponding to a real-world condition of the unique vehicle include:
   vehicle performance characteristics defining at least one of:
      minimum and maximum rotations per minute (RPM) of an engine of the unique vehicle;
      maximum steering radius;
      front and rear brake bias;
      maximum brake torque; or
      shift time;
   vehicle operational characteristics defining at least one of:
      tire pressure;
      oil level; or
      brake pad wear; and
   vehicle state characteristics defining at least one of:
      make and model of the unique vehicle;
      type of tires;
      front or rear wheel drive; or
      weight of the unique vehicle.

3. The system of claim 1, the memory further including instructions that cause the at least one processor to:
   obtain environmental data of a real world environment; and
   construct a simulated environment within the driving simulator based on the environmental data.

4. The system of claim 3, the memory further including instructions that cause the at least one processor to:
   simulate a real world accident within the driving simulator using:
      the simulated environment, wherein the environmental data used for the simulated environment includes data for a location of the real world accident;
      the vehicle performance fingerprint, wherein the vehicle performance fingerprint used in the simulated drive includes vehicle functionality characteristics from a time of the real world accident; and
      data collected from the real world accident in the real world driving conditions; and
   identify a cause of the real world accident.

5. The system of claim 3, wherein a simulated hazard is added to the simulated environment.

6. The system of claim 3, wherein the vehicle performance fingerprint includes data collected from the unique vehicle driving along a roadway course and the environmental data includes information about the roadway course.

7. The system of claim 6, the memory further including instructions that cause the at least one processor to:
perform the simulated drive utilizing driving directives of an autonomous vehicle on the roadway course.

8. The system of claim 1, wherein the vehicle characteristics corresponding to a real-world condition of the unique vehicle are collected from operation of an autonomous vehicle in a real world scenario.

9. The system of claim 1, the memory further including instructions that cause the at least one processor to:
perform training, using machine learning techniques, of an instance of the autonomous driving vehicle model based on results from the execution of the simulated drive, wherein driving policies implemented by the training of the instance of the autonomous driving vehicle model are customized to the vehicle characteristics.

10. At least one non-transitory computer readable medium comprising instructions for simulating vehicle operation that, when executed by at least one processor, cause the at least one processor to:
obtain a vehicle performance fingerprint corresponding to a unique vehicle, wherein the vehicle performance fingerprint includes vehicle characteristics corresponding to data collected from a real-world condition of the unique vehicle;
provide, to an autonomous driving vehicle model, the vehicle performance fingerprint for the unique vehicle, wherein the autonomous driving vehicle model is a trained machine learning model configured to generate a driving policy based on the vehicle performance fingerprint; and
cause execution of a simulated drive in a driving simulator, the driving simulator configured to simulate performance of the unique vehicle, wherein the simulated drive is customized to the generated driving policy and the real-world condition of the unique vehicle.

11. The at least one computer readable medium of claim 10, wherein the vehicle characteristics corresponding to a real-world condition of the unique vehicle include:
vehicle performance characteristics defining at least one of:
minimum and maximum rotations per minute (RPM) of an engine of the unique vehicle;
maximum steering radius;
front and rear brake bias;
maximum brake torque; or
shift time;
vehicle operational characteristics defining at least one of:
tire pressure;
oil level; or
brake pad wear; and
vehicle state characteristics defining at least one of:
make and model of the unique vehicle;
type of tires;
front or rear wheel drive; or
weight of the unique vehicle.

12. The at least one computer readable medium of claim 10, the instructions further to cause the at least one processor to:
obtain environmental data of a real world environment; and
construct a simulated environment within the driving simulator based on the environmental data.

13. The at least one computer readable medium of claim 12, the instructions further to cause the at least one processor to:
simulate a real world accident within the driving simulator using:
the simulated environment, wherein the environmental data used for the simulated environment includes data for a location of the real world accident;
the vehicle performance fingerprint, wherein the vehicle performance fingerprint used in the simulated drive includes vehicle functionality characteristics from a time of the real world accident; and
data collected from the real world accident in real world driving conditions; and
identify a cause of the real world accident.

14. The at least one computer readable medium of claim 13, wherein a simulated hazard is added to the simulated environment.

15. The at least one computer readable medium of claim 13, wherein the vehicle performance fingerprint includes data collected from the unique vehicle driving along a roadway course and the environmental data includes information about the roadway course.

16. The at least one computer readable medium of claim 15, the instructions further to cause the at least one processor to:
perform the simulated drive utilizing driving directives of an autonomous vehicle on the roadway course.

17. The at least one computer readable medium of claim 10, wherein the vehicle characteristics corresponding to a real-world condition of the unique vehicle are collected from operation of an autonomous vehicle in a real world scenario.

18. The at least one computer readable medium of claim 10, the instructions further to cause the at least one processor to:
perform training, using machine learning techniques, of an instance of the autonomous driving vehicle model based on results from the execution of the simulated drive, wherein driving policies implemented by the training of the instance of the autonomous driving vehicle model are customized to the vehicle characteristics.

19. An apparatus, comprising:
means for obtaining a vehicle performance fingerprint corresponding to a unique vehicle, wherein the vehicle performance fingerprint includes vehicle characteristics corresponding to data collected from a real-world condition of the unique vehicle;
means for operating an autonomous driving vehicle model, wherein the autonomous driving vehicle model is a trained machine learning model configured to generate a driving policy from the vehicle performance fingerprint; and
means for executing a simulated drive in a driving simulator, the driving simulator configured to simulate performance of the unique vehicle, wherein the simulated drive is customized to the generated driving policy and the real-world condition of the unique vehicle.

20. The apparatus of claim 19, wherein the means for executing the simulated drive obtains environmental data of a real world environment; and constructs a simulated environment within the driving simulator based on the environmental data;
wherein the vehicle characteristics include:
vehicle performance characteristics defining at least one of:

minimum and maximum rotations per minute (RPM) of an engine of the unique vehicle;
maximum steering radius;
front and rear brake bias;
maximum brake torque; or
shift time;
vehicle operational characteristics defining at least one of:
tire pressure;
oil level; or
brake pad wear; and
vehicle state characteristics defining at least one of:
make and model of the unique vehicle;
type of tires;
front or rear wheel drive; or
weight of the unique vehicle.

21. The apparatus of claim 20, wherein the means for executing the simulated drive simulates a real world accident within the driving simulator using the simulated environment, the vehicle performance fingerprint, and data collected from the real world accident in real world driving conditions, wherein the vehicle performance fingerprint used in the simulated drive includes vehicle functionality characteristics from a time of the real world accident and the environmental data includes data for a location of the real world accident; and generates an identification of a cause of the real world accident.

22. The apparatus of claim 21, wherein the means for executing the simulated drive utilizes driving directives of an autonomous vehicle on a roadway course.

* * * * *

UNITED STATES PATENT AND TRADEMARK OFFICE
CERTIFICATE OF CORRECTION

PATENT NO. : 12,050,842 B2
APPLICATION NO. : 17/353173
DATED : July 30, 2024
INVENTOR(S) : Alvarez et al.

Page 1 of 1

It is certified that error appears in the above-identified patent and that said Letters Patent is hereby corrected as shown below:

In the Claims

In Column 20, Line 61, in Claim 4, after "accident in", delete "the"

In Column 22, Line 62, in Claim 20, after "and", insert a linebreak

In Column 23, Line 26, in Claim 21, after "and", insert a linebreak

Signed and Sealed this
Sixteenth Day of September, 2025

Coke Morgan Stewart
*Acting Director of the United States Patent and Trademark Office*